United States Patent [19]

Geddes

[11] 4,216,486

[45] Aug. 5, 1980

[54] LIGHT EMITTING AND LIGHT DETECTING SEMICONDUCTOR DEVICE FOR INTERFACING WITH AN OPTICAL FIBER

[75] Inventor: John J. Geddes, Minneapolis, Minn.

[73] Assignee: Honeywell Inc., Minneapolis, Minn.

[21] Appl. No.: 13,354

[22] Filed: Feb. 21, 1979

[51] Int. Cl.² .............................................. H01L 31/12
[52] U.S. Cl. .......................................... 357/19; 357/17; 357/30; 357/55; 307/311; 307/214
[58] Field of Search ........................ 357/19, 17, 30, 55; 307/311, 214

[56] References Cited

U.S. PATENT DOCUMENTS

| | | | |
|---|---|---|---|
| 3,703,669 | 11/1972 | London | 317/235 R |
| 3,877,052 | 4/1975 | Dixon | 357/17 |
| 3,881,113 | 4/1975 | Rideont | 250/551 |
| 3,968,564 | 7/1976 | Springthorpe | 29/580 |
| 3,975,643 | 8/1976 | Toth | 250/551 |
| 3,979,587 | 9/1976 | DeCremoux | 250/211 J |
| 4,086,503 | 4/1978 | Fox | 307/363 |
| 4,152,713 | 5/1979 | Copeland | 357/19 |

Primary Examiner—Martin H. Edlow
Attorney, Agent, or Firm—John P. Sumner

[57] ABSTRACT

A light emitting and light detecting semiconductor device having a light emitting zone and a light detecting zone adaptable for concurrently interfacing with an optical fiber.

20 Claims, 4 Drawing Figures

4,216,486

LIGHT EMITTING AND LIGHT DETECTING SEMICONDUCTOR DEVICE FOR INTERFACING WITH AN OPTICAL FIBER

BACKGROUND OF THE INVENTION

1. Field of the Invention

This invention relates to the field of semiconductor devices and, more particularly, to a semiconductor device having a light emitting zone and a light detecting zone adaptable for concurrently interfacing with an optical fiber.

Semiconductor devices such as the present invention are useful in communicating between two points over an optical fiber in lieu of conventional cables and electronic transmission. The advantages of such communication include the electrical isolation commonly obtained with optical couplers as well as an immunity to noise picked up and transmitted by conventional electronic cables.

2. Description of the Prior Art

Semiconductor devices having both a light emitting zone and a light detecting zone do exist. However, I am unaware of any device such as the present invention which is capable of directly interfacing a single optical fiber with separate light emitting and light detecting zones. Thus, to the best of my knowledge, the prior art is comprised of devices having only single zones adaptable for interfacing with an optical fiber. In such devices, the zones perform either both light emitting and light detecting functions, or perform only one of these functions. The present invention has significant advantages over such prior art.

An advantage of the present invention over using one device having a light emitting zone and another device having a light detecting zone is that one does not require a fiber optic assembly having a Y branch leading to separate semiconductor devices. In such a fiber optic assembly, three optical fibers are joined at a junction, thus forming a Y branch having three legs. A first leg goes to a light emitting device, a second legs goes to a light detecting device, and a third leg is used for bidirectional data transmission. By eliminating the Y branch through using a single optical fiber to interface with both the light emitting zone and the light detecting zone, the present invention improves optical transmission since there is no Y branch in which optical losses occur.

In addition, the present invention has advantages over a device having a single zone used for both light emitting and light detecting functions. With the present invention, the operating characteristics of both the light emitting zone and the light detecting zone can be optimized for their respective purposes, while a device having a single zone for both light emission and light detection is generally not optimized for both functions. Thus, a single zone device generally performs at least one of its functions less than optimally, especially when normal biasing voltages are applied.

As a further advantage over single zone devices, the present invention provides separate electrical contacts for the emitter zone and the detector zone. As a result, there is no need to multiplex one electrical contact and share it for both light emitting and light detecting as is necessary if a single zone were used for both functions. Thus, the present invention may allow use of more simple circuitry than is possible with single zone devices performing both functions.

SUMMARY OF THE INVENTION

The present invention is a light emitting and light detecting semiconductor device having a light emitting zone and a light detecting zone adaptable for concurrently interfacing with an optical fiber. The light emitting and light detecting zones extend into a primary region from a first surface of the primary region. The primary region is of a first conductivity type, the zones being of a second conductivity type. A separation region between the zones separates the zones from each other.

A first preferred embodiment of the present invention includes a groove between the zones. In a second preferred embodiment, the separation region includes a separation material different from the material of the primary region extending from the first surface to a depth greater than the depth of either zone. In a third preferred embodiment of the present invention, an optical fiber is interfaced with the device.

DESCRIPTION OF THE PREFERRED EMBODIMENTS

Structure

Figure 1:
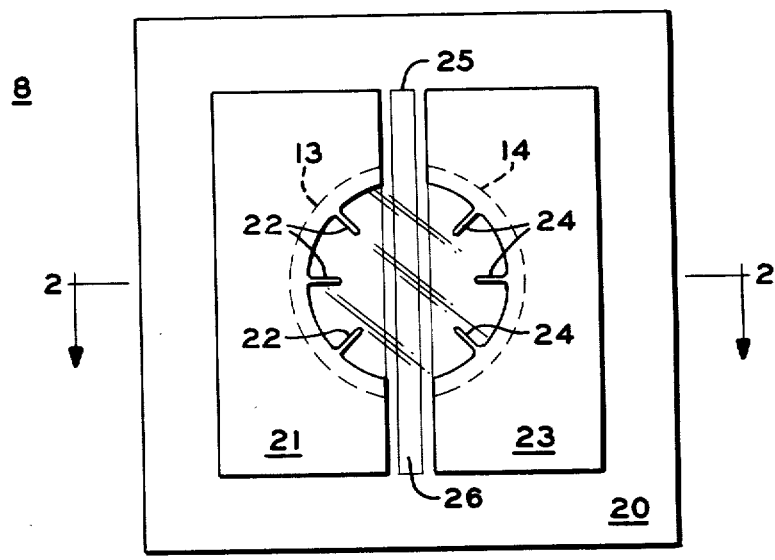
FIG. 1 shows the top view of a preferred embodiment of the present invention.
Figure 2:
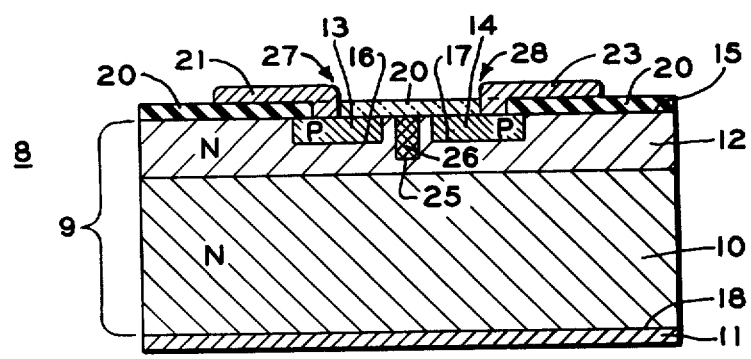
FIG. 2 is a cross section of FIG. 1.
Figure 3:
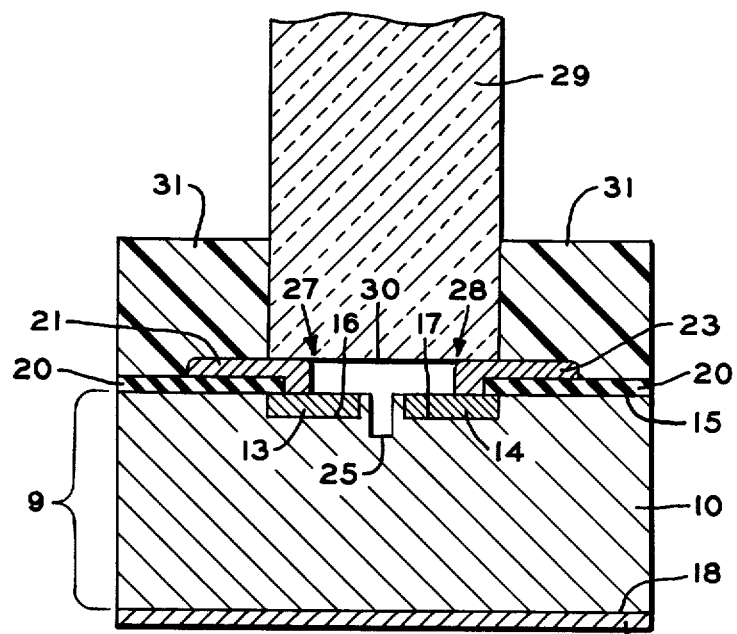
FIG. 3 is an embodiment cross section similar to FIG. 2, together with the addition of an optical fiber and a positioning apparatus for positioning the optical fiber.

Referring to FIGS. 1 and 2, an embodiment 8 of the present invention includes a gallium arsenide or gallium arsenide phosphide primary region 9 which may be comprised of both a substrate 10 and an epitaxial layer 12 grown on substrate 10, or entirely of substrate 10, as is shown in FIG. 3. Epitaxial layer 12 is grown on substrate 10 in order to create a region having relatively well known composition. Typically, substrate 10 is approximately 100 to 200 microns thick, and epitaxial layer 12 is approximately 10 to 50 microns thick, a nominal thickness of epitaxial layer 12 being 20 microns.

Light detecting zone 13 and light emitting zone 14 extend into primary region 9 from a first surface 15 of primary region 9, zones 13 and 14 being separated from each other, typically by a distance of 5 to 10 microns. Typically, zones 13 and 14 are formed of P type material, with primary region 9 being of an N type material. For N type gallium arsenide, the dopant is typically silicon or tellurium; for P type gallium arsenide, germanium is typically used.

A second surface 18 oppositely facing first surface 15 of primary region 9 is typically covered with a metalization layer such as gold, thus forming a primary region contact 11.

Light detecting zone 13 should be of such a nature that whenever a junction 16 between light detecting zone 13 and primary region 9 is reverse biased, incoming radiation is absorbed substantially within an electron diffusion length of junction 16. This can be accomplished by either making light detecting zone 13 transmissive to incoming radiation such that absorption will occur below junction 16 or by making light detecting zone 13 shallow compared to the electron diffusion length of approximately 5 microns. In the latter case, a typical depth of light detecting zone 13 is on the order of 3 microns.

Light detecting zone 13 typically has a doping level on the order of $10^{16}$ atoms per cubic centimeter, a level which is generally less than the doping level of light emitting zone 14. The doping level of light detecting zone 13 is designed to be low enough to allow a wide depletion region between P type zone 13 and N type primary region 9 for absorption of radiation.

Light emitting zone 14 should be of such a nature that whenever a junction 17 between light emitting zone 14 and primary region 9 is forward biased, radiation generated at junction 17 is emitted substantially at the level of first surface 15 rather than being substantially absorbed within the zone. In order to accomplish this, light emitting zone 14 is typically on the order of 5 microns deep.

Light emitting zone 14 has a typical doping level on the order of $10^{18}$ atoms per cubic centimeter in order to achieve high conductivity in the zone and to achieve fast response.

First surface 15 should generally be at least partially covered with a dielectric layer 20 such as silicon dioxide. A primary purpose of dielectric layer 20 is to provide electrical insulation between primary region 9 and any portion of the zone contacts (discussed below) which protrude beyond the area of the zones. In addition, the dielectric layer may help prevent deterioration through contamination and thus may help to prevent leaking of junctions 16 and 17.

Dielectric layer 20 need not cover light detecting zone 13 and light emitting zone 14 any more than is necessary to provide appropriate electrical insulation from the primary region for the zone contacts discussed below. Thus, FIG. 3 shows a portion of the area above zones 13 and 14 being free of any dielectric layer 20.

If light detecting zone 13 and light emitting zone 14 are substantially covered with dielectric layer 20 as shown in FIG. 2, it is necessary that at least an appropriate portion of dielectric 20 be light transmissive in order to permit incoming light to be received by light detecting zone 13 and to permit light emitting zone 14 to emit light. Such a layer over zones 13 and 14, if of appropriate thickness (typically a quarter of a wavelength), can help reduce surface reflection of incoming radiation. In addition, such a layer may help to prevent deterioration. In FIG. 2, a central portion of dielectric layer 20 is crosshatched as being a transparent material, the remaining portion being crosshatched as an electrical insulator.

In order to permit electrical connections to be made to light detecting zone 13 and light emitting zone 14, a separate contact is typically connected to each zone. A light detecting zone contact 21 typically covers a portion of dielectric layer 20 and extends into light detecting zone 13 with at least one protrusion 22 having a first surface area which is small in comparison to the first surface area of light detecting zone 13. Similarly, a light emitting zone contact 23 typically covers at least a portion of dielectric layer 20 and extends into light emitting zone 14 with at least one protrusion 24 having a first surface area which is small in comparison to the first surface area of light emitting zone 14.

Light detecting zone 13, junction 16, primary region 9 and contacts 21 and 11 generally comprise a photodiode 27. Light emitting zone 14, junction 17, primary region 9, and contacts 23 and 11 generally comprise a light emitting diode 28.

Optical isolation between light detecting zone 13 and light emitting zone 14 may be provided either physically by a barrier between the zones or by electronic circuitry permitting only non-simultaneous operation of light detecting zone 13 and light emitting zone 14. If a barrier is desired, it can comprise a groove 25 etched between the two zones and may include a material 26 different from the material of primary region 9 at least partially filling groove 25. It should perhaps be noted that the double crosshatching used to designate material 26 in FIG. 2 is only designating a material different from primary region 9 and is not meant to indicate any particular material or other characteristic.

As previously indicated, FIG. 3 illustrates an embodiment cross section similar to FIG. 2 except that primary region 9 comprises substrate 10 and does not include epitaxial layer 12. In addition, a portion of the area above zones 13 and 14 is shown free of any dielectric layer 20, and groove 25 is shown opening to first surface 15 and being free of any material 26. FIG. 3 also illustrates an optical fiber 29 positioned with a port 30 in proximity to light detecting zone 13 and light emitting zone 14. Also shown is positioning means 31 for positioning optical fiber 29 and port 30.

Operation

In operation, light detecting zone 13 generates a current whenever light is received by zone 13 while junction 16 is reversed biased. Reverse biasing is accomplished by applying a negative potential to light detecting zone contact 21 with primary region contact 11 connected to a reference potential such as ground. Light emitting zone 14 emits light whenever junction 17 is forward biased by applying a positive potential to light emitting zone contact 23 with primary region contact 11 connected to the reference potential.

Figure 4:
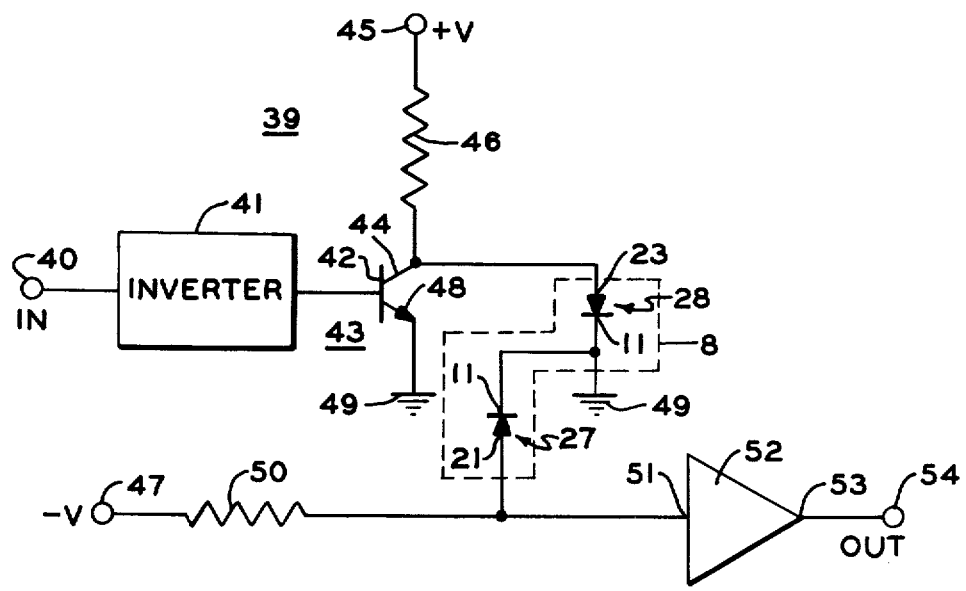
FIG. 4 is a circuit for using the device.

A circuit 39 for operating the device is shown in FIG. 4. Circuit 39 comprises an input terminal 40 adapted to receive two-state logic signals having first and second signal levels. Input terminal 40 is connected to the input of a logic inverter 41 for converting logic highs to logic lows and vice versa. An output of inverter 41 is connected to a base 42 of a transistor 43 which acts as a control means. A collector 44 of transistor 43 is connected to a positive voltage terminal 45 through a resistor 46 as well as to light emitting zone contact 23 of light emitting diode 28. An emitter 48 of transistor 43 is connected to a reference potential 49. Primary region contact 11 of light emitting diode 28 is connected to reference potential 49 as well as to primary region contact 11 of photodiode 27. Light detecting zone contact 21 of photodiode 27 is connected to a negative voltage terminal 47 through a resistor 50 as well as to an input 51 of an amplifier 52. An output 53 of amplifier 52 is connected to an output terminal 54.

When utilizing the present invention, one may select whether to have light emitting diode 28 on either when data received at input terminal 40 is high or when it is low. If it is desired to have light emitting diode 28 on whenever data received at input terminal 40 is high, inverter 41 should be included in circuit 39 as previously described and shown in FIG. 4. If, on the other hand, it is desired that light emitting diode 28 be on whenever data received at input terminal 40 is low, inverter 41 should be eliminated from circuit 39, and input terminal 40 should be connected directly to base 42 of transistor 43.

In operating circuit 39 either with or without inverter 41, whenever data received at base 42 of transistor 43 is high transistor 43 turns on and acts as a switch to conduct the current derived from positive voltage terminal 45 through emitter 48 to reference potential 49. Thus, when transistor 43 is turned on by a high signal level, no voltage is received by light emitting diode 28, thus causing light emitting diode 28 to be off. Whenever the signal level at base 42 of transistor 43 is low (and is thereby below a predetermined threshold) transistor 43 remains off, thus transmitting no current to reference potential 49 and permitting light emitting diode 28 to be on, diode 28 being forward biased by the voltage derived from positive voltage terminal 45.

Photodiode 27 is reverse biased by a negative voltage derived from negative voltage terminal 47. Whenever light is received by photodiode 18 while it is reversed biased, the change in output from photodiode 27 is amplified by amplifier 52 and detected at output terminal 54.

The embodiments of the invention in which an exclusive property or right is claimed are defined as follows:

1. A light emitting and light detecting semiconductor device having a light emitting zone and a light detecting zone adaptable for concurrently interfacing with an optical fiber, comprising:
   a primary region of a first conductivity type;
   the light detecting and light emitting zones being of a second conductivity type extending into the primary region from a first surface of the primary region, the zones being separated from each other by a separation region, a junction being formed at an interface between each zone and the primary region, the zones having a depth measured from the first surface; and
   a separation material different from the material of the primary region, the separation material extending into at least a portion of the separation region from the first surface to a depth greater than the depth of either zone, the separation material providing substantial optical isolation between the two zones.

2. A light emitting and light detecting semiconductor device having a light emitting zone and a light detecting zone adaptable for concurrently interfacing with an optical fiber, comprising:
   a primary region of a first conductivity type;
   the light detecting and light emitting zones being of a second conductivity type extending into the primary region from a first surface of the primary region, the zones being separated from each other by a separation region, a junction being formed at an interface between each zone and the primary region, the zones having a depth measured from the first surface; and
   the device having a groove opening to the first surface between the two zones.

3. A device as in claim 2 wherein the groove extends to a depth greater than the depth of either zone.

4. A semiconductor device as in claim 2 wherein the groove is at least partially filled with a material different from the material of the primary region in order to substantially optically isolate the two zones from each other.

5. A light emitting and light detecting semiconductor device having a light emitting zone and a light detecting zone adaptable for concurrently interfacing with an optical fiber, comprising:
   a primary region of a first conductivity type;
   the light detecting and light emitting zones being of a second conductivity type extending into the primary region from a first surface of the primary region, the zones being separated from each other by a separation region, a junction being formed at an interface between each zone and the primary region, the zones having a depth measured from the first surface; and
   the optical fiber having a port located in proximity to the light detecting and light emitting zones such that at least a portion of any light at the port is received by the light detecting zone and at least a portion of any light emitted by the light emitting zone is received by the port for transmission over the optical fiber.

6. A semiconductor device as in claims 1, 2, or 5 wherein the light detecting zone is of such a nature that, should the junction between the light detecting zone and the primary region be reverse biased, incoming radiation is absorbed substantially within an electron diffusion length of the junction between the light detecting zone and the primary region, and wherein the light emitting zone is of such a nature that, should the junction between the light emitting zone and the primary region be forward biased, radiation generated at the junction between the light emitting zone and the primary region is emitted substantially at the first surface level of the zone rather than being substantially absorbed within the zone.

7. A semiconductor device as in claims 1, 2, or 5 wherein the depth of the light detecting zone is on the order of three microns and wherein the depth of the light emitting zone is on the order of five microns.

8. A semiconductor device as in claims 1, 2, or 5 wherein the primary region and the light emitting zone each have a doping level which is approximately equal to a first doping level and wherein the light detecting zone has a second doping level, the first doping level being approximately two orders of magnitude greater than the second doping level.

9. A semiconductor device as in claims 1, 2, or 5 wherein the primary region is formed of an N type material and wherein both the light detecting and light emitting zones are formed of a P type material.

10. A semiconductor device as in claims 1, 2, or 5 wherein the primary region and the light detecting and light emitting zones are formed of a material selected from the group consisting of gallium arsenide and gallium arsenide phosphide.

11. A semiconductor device as in claims 1, 2, or 5 wherein the primary region further comprises an epitaxial layer adjacent the first surface of the device, the thickness of the layer being in the range of approximately ten to fifty microns.

12. A semiconductor device as in claims 1, 2, or 5 further comprising:
   a light detecting zone contact connected to the light detecting zone;
   a light emitting zone contact connected to the light emitting zone; and
   a primary region contact connected to the primary region and adapted for connecting the primary region to a reference potential.

13. A semiconductor device as in claims 1, 2, or 5 further comprising:

a dielectric layer covering at least a portion of the first surface;

a light detecting zone contact covering at least a portion of the dielectric layer and extending into the light detecting zone with a protrusion having a first surface area which is small in comparison with the first surface area of the light detecting zone;

a light emitting zone contact covering at least a portion of the dielectric layer and extending into the light emitting zone with a protrusion having a first surface area which is small in comparison to the first surface area of the light emitting zone.

14. A semiconductor device as in claims 1, 2, or 5 wherein the primary region has a second surface and wherein a primary region contact is connected to the primary region and covers at least a portion of the second surface, the primary region contact being adapted for connecting the primary region to a reference potential.

15. A semiconductor device as in claims 1, 2, or 5 wherein the primary region has a second surface oppositely facing the first surface and wherein a primary region contact is connected to the primary region and covers at least a portion of the second surface, the primary region contact being adapted for connecting the primary region to a reference potential.

16. A semiconductor device as in claims 1, 2, or 5 wherein the zones are separated from each other by a distance of approximately five to ten microns.

17. A device as in claims 1 or 2 further comprising the optical fiber having a port located in proximity to the light detecting and light emitting zones such that at least a portion of any light at the port is received by the light detecting zone and at least a portion of any light emitted by the light emitting zone is received by the port for transmission over the optical fiber.

18. A device as in claims 1, 2, or 5 further comprising positioning means connected to the device, the positioning means being adapted for positioning a port of an optical fiber in proximity to the light detecting and light emitting zones.

19. A device as in claims 1, 2, or 5 further including an electrical circuit, comprising:

an input terminal for receiving input signals having first and second levels;

means comprising control means connected between the input terminal and the light emitting zone for permitting the application of a positive voltage to the light emitting zone whenever the first signal level is present at the input terminal;

a positive voltage terminal adapted to receive the positive voltage;

means connecting the positive voltage terminal to the control means;

a negative voltage terminal adapted to receive a negative voltage;

means connecting the negative voltage terminal to the light detecting zone;

an output terminal; and means connecting the output terminal to the light detecting zone for providing a signal at the output terminal whenever light is received by the light detecting zone while the junction between the light detecting zone and the primary region is reverse biased.

20. A device as in claims 1, 2, or 5 further including an electrical circuit, comprising:

an input terminal for receiving input signals having first and second signal levels;

a positive voltage terminal adapted to receive a positive voltage;

a negative voltage terminal adapted to receive a negative voltage;

means connecting the negative voltage terminal to the light detecting zone;

inverter means for converting logic highs to logic lows and vice versa, the inverter means having an input connected to the input terminal, the inverter means also having an output;

control means comprising a transistor with a base connected to the output of the inverter means, an emitter adapted for connection to a reference potential, and a collector;

means connecting the collector of the transistor to the light emitting zone;

means connecting the collector of the transistor to the positive voltage terminal;

an amplifier having an input and an output;

means connecting the input of the amplifier to the light detecting zone;

an output terminal;

means connecting the output terminal to the output of the amplifier; and means adaptable for connecting the primary region to the reference potential.

* * * * *